(12) United States Patent
Tomita et al.

(10) Patent No.: US 9,281,805 B2
(45) Date of Patent: Mar. 8, 2016

(54) CLOCK CONTROL CIRCUIT, RECEIVER, AND COMMUNICATION DEVICE

(71) Applicant: FUJITSU LIMITED, Kawasaki-shi, Kanagawa (JP)

(72) Inventors: Yasumoto Tomita, Kawasaki (JP); Toshihiko Mori, Isehara (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/595,921

(22) Filed: Jan. 13, 2015

(65) Prior Publication Data

US 2015/0229298 A1    Aug. 13, 2015

(30) Foreign Application Priority Data

Feb. 7, 2014   (JP) ................. 2014-022510

(51) Int. Cl.
    *H03K 3/012*    (2006.01)
    *H03K 5/15*    (2006.01)
    *H03K 5/00*    (2006.01)
    *H04L 7/00*    (2006.01)

(52) U.S. Cl.
    CPC .......... *H03K 3/012* (2013.01); *H03K 5/00006* (2013.01); *H03K 5/15066* (2013.01); *H04L 7/0029* (2013.01); *H04L 7/0079* (2013.01); *H03K 2005/00286* (2013.01)

(58) Field of Classification Search
    None
    See application file for complete search history.

(56) References Cited

U.S. PATENT DOCUMENTS

| 6,529,052 | B2 * | 3/2003 | Wang | 327/120 |
| 6,812,777 | B2 * | 11/2004 | Tamura et al. | 327/540 |
| 2002/0070783 | A1 * | 6/2002 | Saeki | 327/235 |
| 2009/0245449 | A1 | 10/2009 | Umai et al. | |
| 2011/0249775 | A1 | 10/2011 | Koyanagi | |

FOREIGN PATENT DOCUMENTS

| JP | 2009-239768 A | 10/2009 |
| JP | 2011-223366 A | 11/2011 |
| JP | 2012-054720 A | 3/2012 |
| JP | 2012-147195 A | 8/2012 |

\* cited by examiner

*Primary Examiner* — Leon-Viet Nguyen
(74) *Attorney, Agent, or Firm* — Arent Fox LLP

(57) ABSTRACT

A clock control circuit includes: a first buffer that receives a first pair of input clocks of multi-phase clocks, buffers and outputs the first pair of input clocks; a second buffer that receives a second pair of input clocks of the multi-phase clocks, and is controllable to buffer and output the second pair of input clocks or to output a fixed level; and a frequency multiplier that performs a logical operation on an output of the first buffer and an output of the second buffer, and outputs a first pair of output clocks or a second pair of output clocks as an output clocks, the first pair of output clocks is based on a frequency which is obtained by multiplying frequencies of the multi-phase clocks, and the second pair of output clocks is based on the same frequencies as the multi-phase clocks.

13 Claims, 15 Drawing Sheets

| SPD \ OUTPUT | OUT1 | OUT2 |
|---|---|---|
| "L" (AT THE TIME OF NORMAL OPERATION) | Ock270 | Ock90 |
| "H" (AT THE TIME OF POWER-DOWN) | L | H |

PHASE SHIFT BY PI 22

CLOCK CONTROL CIRCUIT, RECEIVER, AND COMMUNICATION DEVICE

CROSS-REFERENCE TO RELATED APPLICATION

This application is based upon and claims the benefit of priority of the prior Japanese Patent Application No. 2014-022510 filed on Feb. 7, 2014, the entire contents of which are incorporated herein by reference.

FIELD

The embodiments discussed herein are related to a clock control circuit, a receiver and a communication device.

BACKGROUND

In recent years, a performance of a component that is applied to a computer or an information processing apparatus other than the computer has been significantly improved. For example, there has been a remarkable improvement in performance of a semiconductor memory device such as a static random access memory (SRAM) or a dynamic random access memory (DRAM), and a central processing unit (CPU) or a large scale integration (LSI) for a switch.

Thus, with the improved performance of the semiconductor memory device or the processor, if a signal transmission speed between components or configuration elements is not improved, a point is reached where it is difficult to improve a system performance.

That is, improvement of a signal transmission speed is important between a main storage device such as a DRAM and a processor, between servers via a network or between boards (printed wiring substrate), between semiconductor chips, or between elements or circuit blocks in one chip.

However, for example, in order to speed up the signal transmission, it is preferable that a serial transmission method which may remove skew between bits caused by a wire length difference that is a problem in a parallel transmission method, be applied.

Specifically, a communication speed of a circuit (for example, serializer and deserializer (SerDes):parallel-serial conversion circuit) that transmits and receives data at a high speed reaches several tens of Gbps.

Then, Ethernet (registered trademark) already uses a transmission standard of 25 Gbps, and furthermore, standardization of 40 Gbps or 56 Gbps (for example, CEI-56G-VSR) is also progressing.

In addition, in recent years, for example, for a high speed I/O (receiver and communication device), both an increase of transmission speed×the number of channels, and a low power consumption have been demanded. For this reason, for example, a high speed I/O transmits clocks of a low frequency output from a clock generator, and generates multi-phase clocks using a delay locked loop (DLL) or an injection locked voltage controlled oscillator (IL-VCO), in the channels of each transmitter and each receiver.

Furthermore, the phases of the generated multi-phase clocks are adjusted by a phase interpolator (PI) that is controlled by a phase code from a clock data recovery (CDR).

Then, by frequency-multiplying the multi-phase clocks, phases of which are adjusted, clocks of a desired high frequency are generated, and the clocks are distributed to a multiplexer (MUX) in a transmitter, or a determination unit or a demultiplexer (DMX) in a receiver. Thus, it is possible to realize a signal transmission with a low power consumption at a high speed.

However, in recent years, various receivers (communication devices) which may perform a correct data transmission and receipt even in a high data transmission rate have been proposed.

As described above, for example, a high speed I/O provides a configuration that may perform a signal transmission with a low power consumption and a high speed. In addition, a latest high speed I/O (receiver) demands a configuration that includes not only a high speed function, but also interoperability with a high speed I/O of a previous generation, and that corresponds to a plurality of data rates with frequencies different from each other by two times or more.

For this reason, for example, sensitivity of a DLL is increased and the increased sensitivity corresponds to a wide range of clock frequency, or a variable capacitor for securing linearity of the PI that is provided in a receiver is provided. However, in such correspondence, if the sensitivity of the DLL is increased, for example, the frequency deviates even with respect to a small variation in a control voltage of the DLL, or if a capacitor is added to the PI, a frequency band is limited.

That is, for example, in order to correspond to the plurality of data rates with frequencies different from each other by two times or more, if the configurations of the DLL or the PI are changed, a clock performance at a high frequency band such as several GHz or higher is lower, which is not desired.

The followings are reference documents.
[Document 1] Japanese Laid-open Patent Publication No. 2009-239768,
[Document 2] Japanese Laid-open Patent Publication No. 2011-223366,
[Document 3] Japanese Laid-open Patent Publication No. 2012-054720, and
[Document 4] Japanese Laid-open Patent Publication No. 2012-147195.

SUMMARY

According to an aspect of the invention, a clock control circuit includes: a first buffer that receives a first pair of input clocks of multi-phase clocks, buffers and outputs the first pair of input clocks; a second buffer that receives a second pair of input clocks of the multi-phase clocks, and is controllable to buffer and output the second pair of input clocks or to output a fixed level; and a frequency multiplier that performs a logical operation on an output of the first buffer and an output of the second buffer, and outputs a first pair of output clocks or a second pair of output clocks as an output clocks, the first pair of output clocks is based on a frequency which is obtained by multiplying frequencies of the multi-phase clocks, and the second pair of output clocks is based on the same frequencies as the multi-phase clocks.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
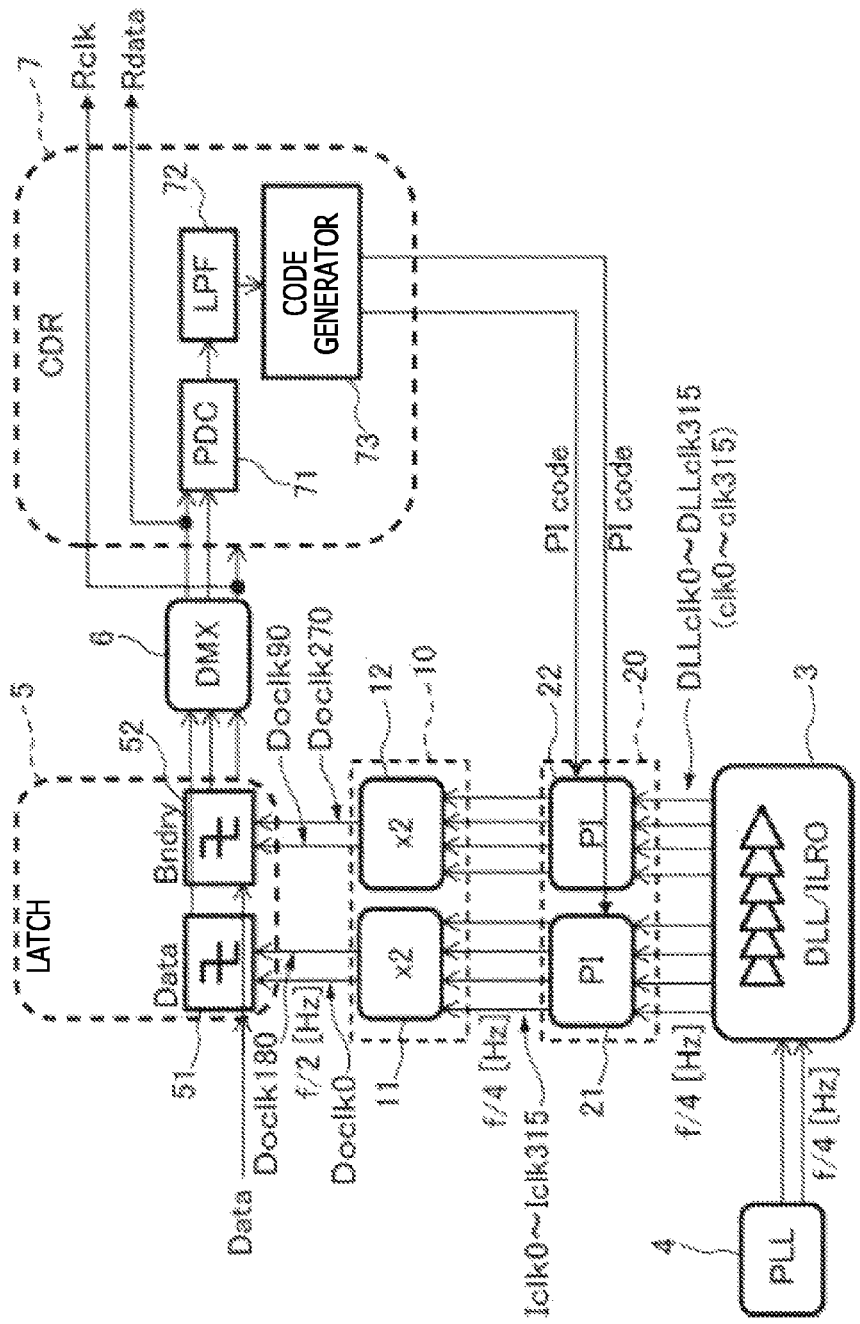
FIG. 1 is block diagram illustrating an example of a receiver.
Figure 2:
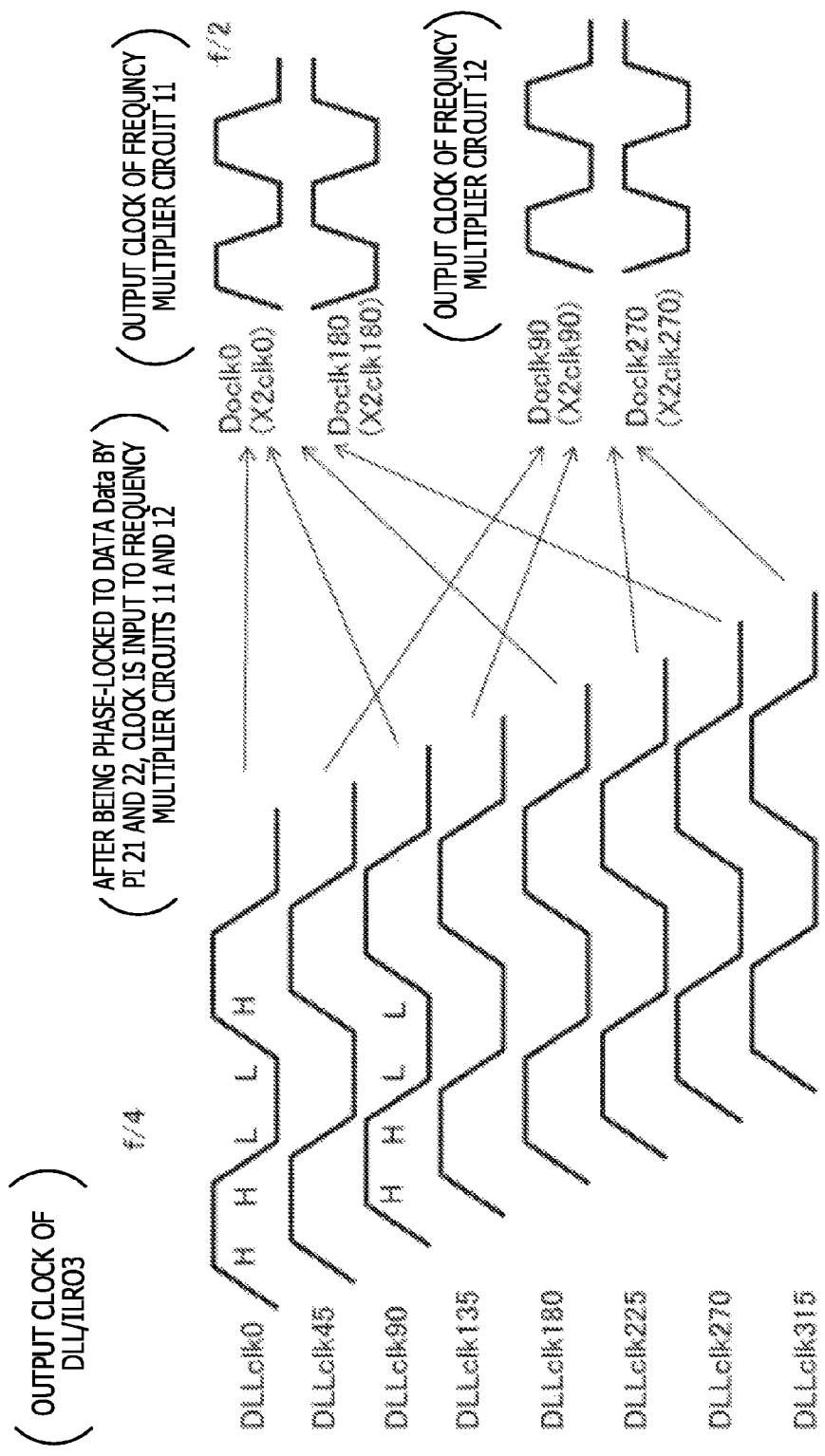
FIG. 2 is a diagram for explaining an operation of the receiver illustrated in FIG. 1.

Before a clock control circuit, a receiver, and a communication device according to the present embodiment are described in detail, an example of the receiver and problems thereof will be first described, with reference to FIG. 1 and FIG. 2. FIG. 1 is a block diagram illustrating an example of the receiver.

As illustrated in FIG. 1, the receiver 8 includes the clock control circuit 10, a phase interpolation circuit 20, and a delay locked loop or an injection locked ring oscillator (DLL/ILRO) 3. In addition, the phase interpolation circuit 20 includes phase interpolators (PIs) 21 and 22.

The receiver 8 includes a phase locked loop (PLL) 4, a latch (decision latch) 5, a demultiplexer (DMX) 6, and a clock data recovery (CDR) 7. In addition, the DLL/ILRO 3 may be an injection locked voltage controlled oscillator (IL-VCO).

The latch 5 includes a data determination circuit 51 that receives, for example, serial data Data and determines a value of the data Data (high level "H"/low level "L"), and a boundary determination circuit 52 that determines a boundary. Outputs Data of the determination circuits 51 and 52 are input to the DMX 6, and, for example, a parallel recovery clock Rclk and recovery data Rdata are obtained.

The CDR 7 that receives an output of the DMX 6 includes a phase detection circuit (PDC) 71, a low-pass filter (LPF) 72, and a code generator 73.

Here, the code generator 73 outputs a phase code PIcode to the PI 21 and 22. The PIs 21 and 22 generate clocks following the phases of the outputs Data of the determination circuits 51 and 52, based on the phase code PIcode, and output the generated clocks to the clock control circuit 10 (frequency multiplication circuits 11 and 12).

FIG. 2 is a diagram for explaining an operation of the receiver illustrated in FIG. 1. The numbers (0, 45, 90, ..., 315) after each clock clk indicate the phases (°: phase at the time of normal operation) of each clock. For example, the DLL/ILRO 3 receives a clock with f/4 Hz from the PLL 4, and generates eight-phase clocks DLLclk0, DLLclk45, DLLclk90, DLLclk135, DLLclk180, DLLclk225, DLLclk270, and DLLclk315, phases of which are different from each other by 45°, and outputs the clocks to the PIs 21 and 22.

For example, the PI 21 receives four-phase clocks DLLclk0, DLLclk90, DLLclk180, and DLLclk270, phases of which are different from each other by 90°, from the DLL/ILRO 3, and outputs clocks, phases of which are adjusted based on the phase code PIcode from the CDR 7 to the frequency multiplication circuit 11.

For example, the frequency multiplication circuit 11 receives the four-phase clocks Iclk0, Iclk90, Iclk180, and Iclk270 with f/4 frequency from the PI 21, and generates complementary clocks Doclk0 (X2clk0) and Doclk180 (X2clk180), phases of which are different from each other by 180°, with f/2 frequency that is obtained by being multiplied by 2. The data determination circuit 51 determines data Data, based on the output clocks Doclk0 and Doclk180 with f/2 frequency from the frequency multiplication circuit 11.

For example, the PI 22 receives the four-phase clocks DLLclk45, DLLclk135, DLLclk225, and DLLclk315, phases of which are different from each other by 90°, from the DLL/ILRO 3, and outputs the clocks, phases of which are adjusted based on the phase code PIcode from the CDR 7 to the frequency multiplication circuit 12.

In addition, the four-phase clocks DLLclk0, DLLclk90, DLLclk180, and DLLclk270 that are input to the PI 21, and the four-phase clocks DLLclk45, DLLclk135, DLLclk225, and DLLclk315 that are input to the PI 22 have a phase difference of 45° between each other.

For example, the frequency multiplication circuit 12 receives the four-phase clocks Iclk45, Iclk135, Iclk225, and Iclk315 with f/4 frequency from the PI 22, and generates complementary clocks Doclk90 (X2clk90) and Doclk270 (X2clk270), phases of which are different from each other by 180°, with f/2 frequency that is obtained by being multiplied. The boundary determination circuit 52 determines (detects) data boundary, based on the output clocks Doclk90 and Doclk270 with f/2 frequency from the frequency multiplication circuit 12.

Here, the clocks Doclk0 and Doclk180 that are input to the data determination circuit 51, and the clocks Doclk90 and Doclk270 to the boundary determination circuit 52 have a phase difference of 90° between each other. In addition, the frequency (f/2) of the clocks Doclk0 and Doclk270 is obtained by multiplying the frequency (f/4) of the output clocks DLLclk0 to DLLclk315 of the DLL/ILRO 3 by 2.

In addition, for example, as the frequency multiplication circuits 11 and 12, an exclusive OR (EXOR) circuit and/or an exclusive NOR (EXNOR) circuit may be applied.

Then, by feedback-controlling the clocks Doclk90 and Doclk270 of the boundary determination circuit 52 via the CDR 7, the PI 22, and the like, the data determination circuit 51 that is controlled by the clocks Doclk0 and Doclk180 performs data determination at an appropriate timing. That is, for example, the data determination circuit 51 performs sampling at an approximate center of the data eye, and thereby may correctly determine the data Data.

However, in recent years, for example, for a high speed I/O (receiver, communication device), an increase of a transmission capacity (increase of a total band width), that is an increase of transmission speed×the number of channels, and a low power consumption have been demanded.

For this reason, the high speed I/O transmits clocks with a low frequency (for example, f/4) output from a clock generator (for example, PLL 4 of FIG. 1), and generates multi-phase clocks using a DLL or an IL-VCO (for example, DLL/ILRO 3 of FIG. 1), in the channels of each transmitter and each receiver.

Then, by multiplying the generated multi-phase clocks, a frequency with a desired high frequency (for example, f/2) is generated, and is distributed to a multiplexer (MUX) in a transmitter, or a determination unit or demultiplexer (DMX 6 of FIG. 1) in a receiver. As a result, at a high transmission speed, a signal transmission with a low power consumption is realized.

However, a latest high speed I/O (receiver) desires a configuration that includes not only a high speed function, but also interoperability with a high speed I/O of a previous generation, and that corresponds to a plurality of data rates (multi-data rates) with frequencies different from each other by two times or more.

For this reason, for example, sensitivity (Hz/V) of a DLL is increased and the increased sensitivity corresponds to a wide range of clock frequency, or a variable capacitor for securing linearity of the PI that is provided in a receiver is provided, thereby corresponding to multi-data rates.

However, in such correspondence, if the sensitivity of the DLL is increased, for example, the frequency deviates with respect to a small variation in a control voltage of the DLL, and thus, jitter increases, and in addition, if a capacitor is added to the PI, a frequency band is limited.

That is, there is a problem that for example, in order to correspond to the plurality of data rates with frequencies different from each other by two times or more, if the configurations of the DLL or the PI are changed, a clock performance at a high frequency band that is several GHz is lower.

Hereinafter, a clock control circuit, a receiver, and a communication device according to the present embodiment will be described in detail with reference to the accompanying drawings. Here, for example, the clock control circuit according to the present embodiment may be applied as the clock control circuit 10 of the receiver illustrated in FIG. 1 described above, but is not limited to this, and may be applied as a clock control circuit of various circuits.

In addition, for example, in the following description, the time of a normal operation corresponds to a case where a clock with a f/2 frequency that is obtained by multiplying (multiplying by 2) the f/4 frequency of the clock which is input to the clock control circuit 90 (10) is output. In addition, the time of power-down corresponds to a case where a clock with a f/4 frequency that is the same as the f/4 frequency of the clock which is input to the clock control circuit 90 is output.

Figure 3:
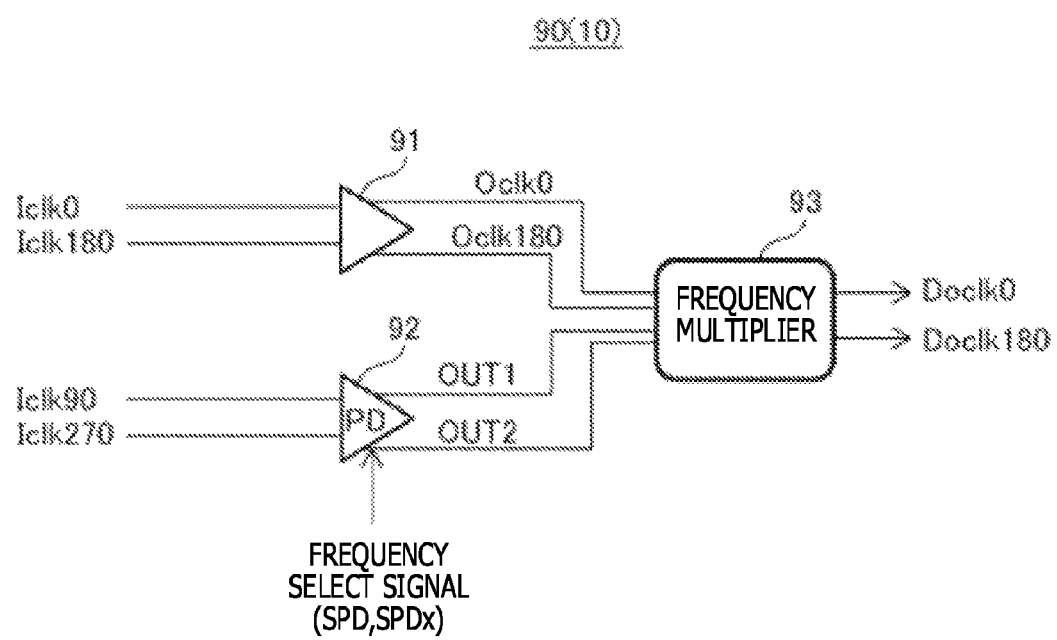
FIG. 3 is a block diagram illustrating a first embodiment of a clock control circuit.
Figures 4A, 4B:
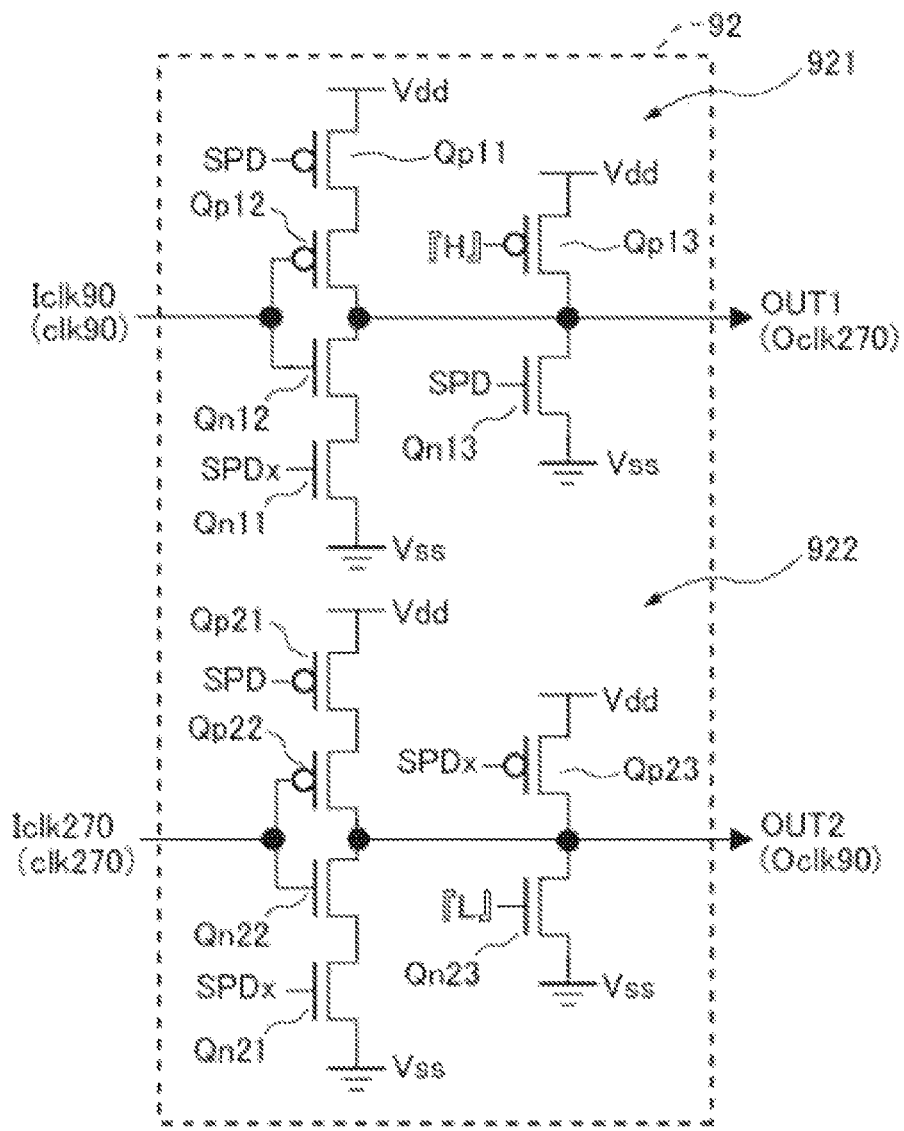
FIGS. 4A and 4B are diagrams for explaining an example of a power-down-equipped buffer of the clock control circuit illustrated in FIG. 3.

FIG. 3 is a block diagram illustrating a first embodiment of the clock control circuit, and FIGS. 4A and 4B are diagrams for explaining an example of a power-down-equipped buffer of the clock control circuit 90 illustrated in FIG. 3. Here, FIG. 4A is a circuit diagram illustrating an example of the power-down-equipped buffer 92, and FIG. 4B is a diagram for explaining an operation of the power-down-equipped buffer 92 illustrated in FIG. 4A.

As illustrated in FIG. 3, the clock control circuit 90 according to the first embodiment receives the four-phase clocks Iclk0, Iclk90, Iclk180, and Iclk270, phases of which are different from each other by 90°, for example, and outputs complementary clocks Doclk0 and Doclk180, phases of which are different from each other by 180°. In addition, for example, the clock control circuit 90 corresponds to the clock control circuit 10 of the receiver 8 illustrated in FIG. 1.

The clock control circuit 90 includes two buffers 91 and 92. The first buffer 91 receives the complementary clocks (first input clock pair) Iclk0 and Iclk180, phases of which are different from each other by 180°, and buffers the clocks Iclk0 and Iclk180 and outputs the clocks. That is, the output clocks Oclk0 and Oclk180 of the first buffer 91 are constantly the same (buffered) as the first input clock pair Iclk0 and Iclk180.

The second buffer (power-down-equipped buffer) 92 receives the complementary clocks (second input clock pair) Iclk90 and Iclk270, phases of which are different from each other by 180°, and may perform control whether to buffer the clocks Iclk90 and Iclk270 and output the clocks, or to output a fixed level. Here, the first input clock pair Iclk0 and Iclk180 and the second input clock pair Iclk90 and Iclk270 have a phase difference of 90° between each other.

As illustrated in FIG. 4A, the power-down-equipped buffer 92 includes two buffer units 921 and 922. The first buffer unit 921 includes pMOS transistors Qp11 to Qp13 and nMOS transistors Qn11 to Qn13. Here, the transistors Qp12 and Qn12 form a first inverter, invert the clock Iclk90 that is input, and output to an output OUT1.

The pMOS transistor Qp11, to a gate of which a frequency selection signal SPD is input is inserted between the first inverter (Qp12, Qn12) and a high potential power supply line Vdd. In addition, the nMOS transistor Qn11, to a gate of which a frequency selection signal SPDx of logical inversion is input is inserted between the first inverter and a low potential power supply line Vss.

The transistor Qp13, a gate of which is fixed to a high level "H", is provided between the output OUT1 of the first buffer unit 921 and the high potential power supply line Vdd, and the transistor Qn13 for pull-down, to a gate of which the frequency selection signal SPD is input, is provided between the output OUT1 and the low potential power supply line Vss. Here, the transistor Qp13 is intended to retain the symmetry of a circuit, and thus is turned off constantly.

In the same manner, the second buffer unit 922 includes pMOS transistors Qp21 to Qp23 and nMOS transistors Qn21 to Qn23. Here, the transistors Qp22 and Qn22 form a second inverter, invert the clock Iclk270 that is input, and output to an output OUT2.

The pMOS transistor Qp21, to a gate of which the frequency selection signal SPD is input is inserted between the second inverter (Qp22, Qn22) and the high potential power supply line Vdd. In addition, the nMOS transistor Qn21, to a gate of which a frequency selection signal SPDx is input is inserted between the second inverter and the low potential power supply line Vss.

The transistor Qp23 for pull-up, to a gate of which the frequency selection signal SPDx is input, is provided between an output OUT2 of the second buffer unit 922 and the high potential power supply line Vdd, and the transistor Qn23, a gate of which is fixed to a low level "L", is provided between the output OUT2 and the low potential power supply line Vss. Here, the transistor Qn23 is intended to retain the symmetry of a circuit, and thus is turned off constantly.

The buffer units 921 and 922 illustrated in FIG. 4A are configured to invert a logic of the input clock using one inverter (Qp12, Qn12 and Qp22, Qn22), respectively, and output the logic but may be configured to make logics of input and output consistent with each other by forming inverters with two stages.

As illustrated in FIG. 4B, at the time of a normal operation (first mode), the frequency selection signal SPD goes to a low level "L", and thereby the transistors Qp11, Qp21, Qn11, and Qn21 are turned on, the first inverter (Qp12, Qn12) and the second inverter (Qp22, Qn22) are in an operation state. In addition, as previously described, the frequency selection signal SPDx is an inverted logic signal of the frequency selection signal SPD, and thus, when the frequency selection signal SPD goes to a logic level "L", the frequency selection signal SPDx goes to a high level "H".

As a result, a signal clk90x (clk270:Oclk270) that is obtained by inverting the input clock Iclk90 (clk90) is output to the output OUT1 of the first buffer unit 921. In addition, a signal clk270x (clk90:Oclk90) that is obtained by inverting the input clock Iclk270 (clk270) is output to the output OUT2 of the second buffer unit 922. Here, in a normal operation mode in which the frequency selection signal SPD is in a low logic "L", the transistor Qn13 and Qp23 are turned off, and thus, operations of the first and second inverters are not influenced.

Accordingly, at the time of a normal operation, for example, four-phase clocks Oclk0, Oclk90, Oclk180, and Oclk270, phases of which are different from each other by 90° are input to the frequency multiplier 93, and for example, in the same manner as the frequency multiplication circuit 11 of FIG. 1 previously described, complementary clocks Doclk0 and Doclk180 are generated.

That is, at the time of a normal operation, the clock control circuit 90 receives, for example, the four-phase clocks Iclk0, Iclk90, Iclk180, and Iclk270 with f/4 frequency, and outputs by generating the complementary clocks Doclk0 and Doclk180 with f/2 frequency that is obtained by being multiplied by 2.

Next, at the time of power-down (second mode), the frequency selection signal SPD goes to a high level "H" (frequency selection signal SPDx goes to a low level "L"), and thereby the transistors Qp11, Qp21, Qn11, and Qn21 are turned off, the first inverter (Qp12, Qn12) and the second inverter (Qp22, Qn22) are in a non-operation state.

At this time, in the first buffer unit 921, the transistor Qn13 for pull-down is turned on, and a fixed low level "L" is output to the output OUT1. In addition, in the second buffer unit 922, the transistor Qp23 for pull-up is turned on, and a fixed high level "H" is output to the output OUT2.

Figure 5:
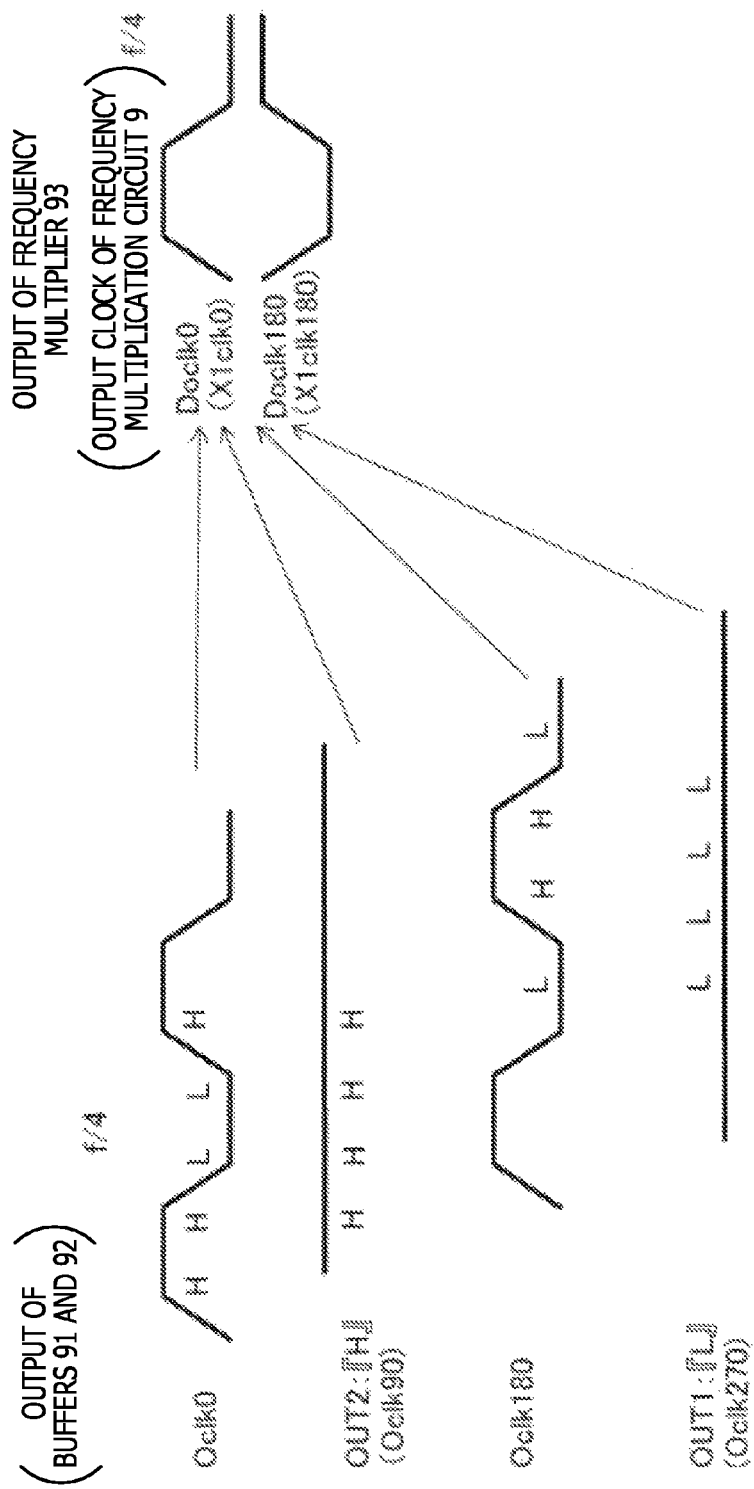
FIG. 5 is a diagram for explaining an operation of the clock control circuit illustrated in FIG. 3.

FIG. 5 is a diagram for explaining an operation of the clock control circuit illustrated in FIG. 3, for explaining the operation of the clock control circuit 90 at the time of power-down.

As described with reference to the FIG. 4B, at the time of power-down, the second buffer unit 92 outputs fixed levels in which the output OUT1 of the first buffer unit 921 is in a low level "L" and the output OUT2 of the second buffer unit 922 is in a high level "H". In addition, the first buffer 91 outputs the complementary clocks Oclk0 and Oclk180 with f/4 frequency.

The output clocks Ockl0 and Oclk180 from the first buffer 91, and outputs OUT1 ("L") and OUT2 ("H"), which have fixed levels, from the second buffer unit 92, are input to the frequency multiplier 93.

For example, the frequency multiplier 93 performs an exclusive NOR (EXNOR) operation on the output OUT2 with a fixed level "H" and the clock Oclk0, and generates the clock Dclk0 (clk0). Furthermore, for example, the frequency multiplier 93 performs an exclusive OR (EXOR) operation on the output OUT1 with a fixed level "L" and the clock Oclk180, and generates the clock Dclk180 (clk180).

Accordingly, for example, at the time of power-down, the clock control unit 90 receives the four-phase clocks Iclk0, Iclk90, Iclk180, and Iclk270 with f/4 frequency, and generates the complementary clocks Doclk0 and Doclk180 with f/4 frequency that is the same frequency (multiplied by 1) and outputs the complementary clocks.

That is, according to the clock control circuit of the first embodiment, the frequencies of the output clocks Doclk0 and Doclk180 may be controlled by selection to have the f/4 frequency that is equal (multiplied by 1) to that of the input clock, or the f/2 frequency that is obtained by being multiplied (multiplied by 2), by the frequency selection signals SPD and SPDx.

In this way, according to the clock control circuit of the first embodiment, it is possible to correspond to the data rates with frequencies different from each other by two times, without changing the configuration of the DLL or the PI, and without the clock performance being degrading at a high frequency band, for example.

In addition, as previously described, for example, the buffer units 921 and 922 that are illustrated in FIG. 4A may make the logics of input and output consistent with each other by forming inverters with two stages. In addition, FIG. 4A, FIG. 4B, and FIG. 5 are intended to describe a simple example, and a logic and a circuit configuration of each signal may also be variously modified.

Figure 6:
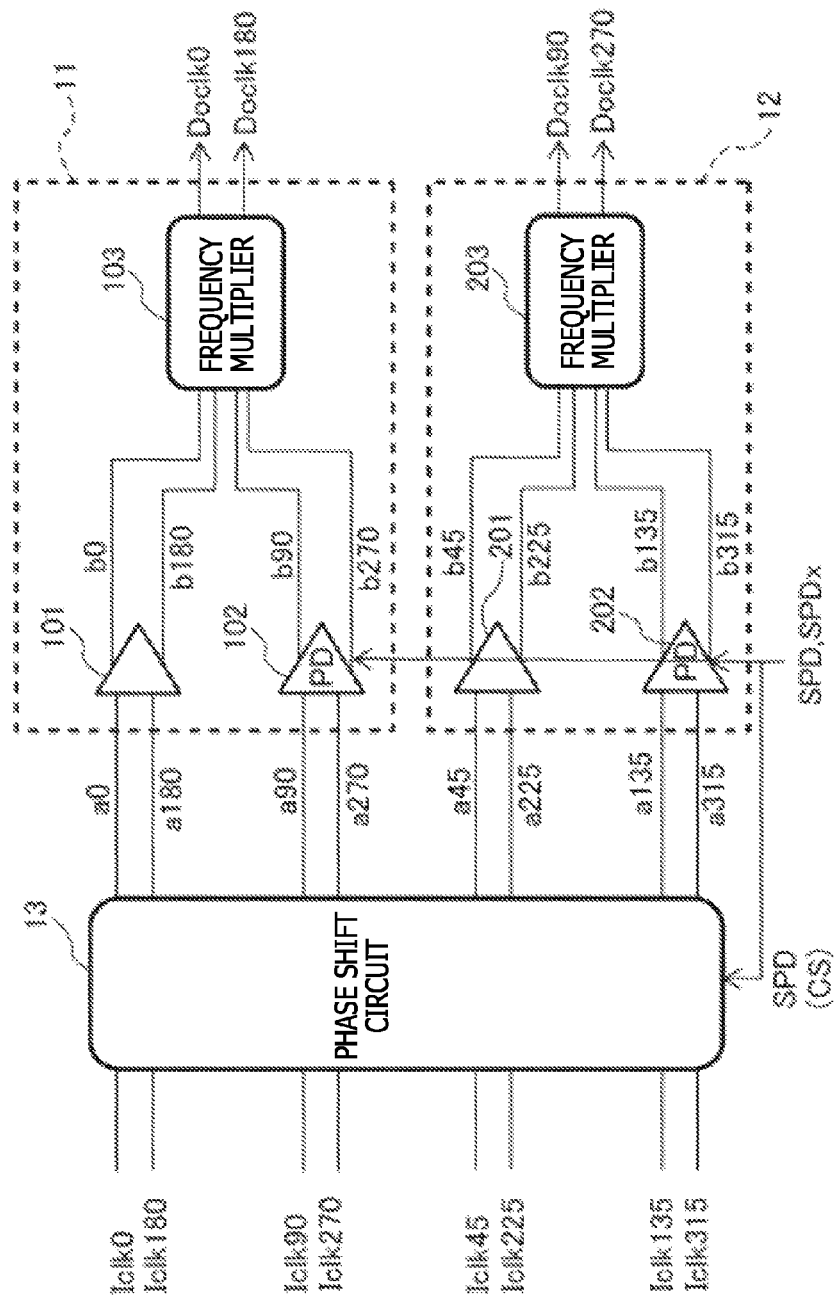
FIG. 6 is a block diagram illustrating a second embodiment of the clock control circuit.

FIG. 6 is a block diagram illustrating a second embodiment of the clock control circuit, and illustrates that four-phase clocks Doclk0, Doclk90, Doclk180, and Doclk270, phases of which are different from each other by 90°, are output.

As may be seen from comparison of FIG. 6, and FIG. 1 and FIG. 3 that are described above, the clock control circuit 1 according to the second embodiment corresponds to, for example, the clock control circuit 10 of the receiver 8 illustrated in FIG. 1, and includes two frequency multiplication circuits 11 and 12, and a phase shift circuit 13.

Here, the frequency multiplication circuits 11 and 12 have the same configurations as those in FIGS. 3 to 5, and for example, the same circuit configuration as that of the clock control circuit 90 that is described with reference to FIGS. 3 to 5 may be applied to the frequency multiplication circuits 11 and 12. In addition, in the following description, input and output logics of each of buffers 101, 102, 201, and 202 are described so as to be consistent with each other.

For example, this corresponds to the logics of the input and output being consistent with each other due to the inverters of the buffer units 921 and 922 being configured as two stages as illustrated in FIG. 4, but also corresponds to the complementary output clocks Oclk270 and Oclk90 of the power-down-equipped buffer (second buffer) 92 replacing each other.

As illustrated in FIG. 6, for example, the phase shift circuit 13 receives the eight-phase clocks Iclk0 to Iclk315 (first multi-phase clocks), phases of which are different from each other by 45° with f/4 frequency, and outputs eight-phase clocks a0 to a315 (second multi-phase clocks), phases of which are shifted.

Figure 7:
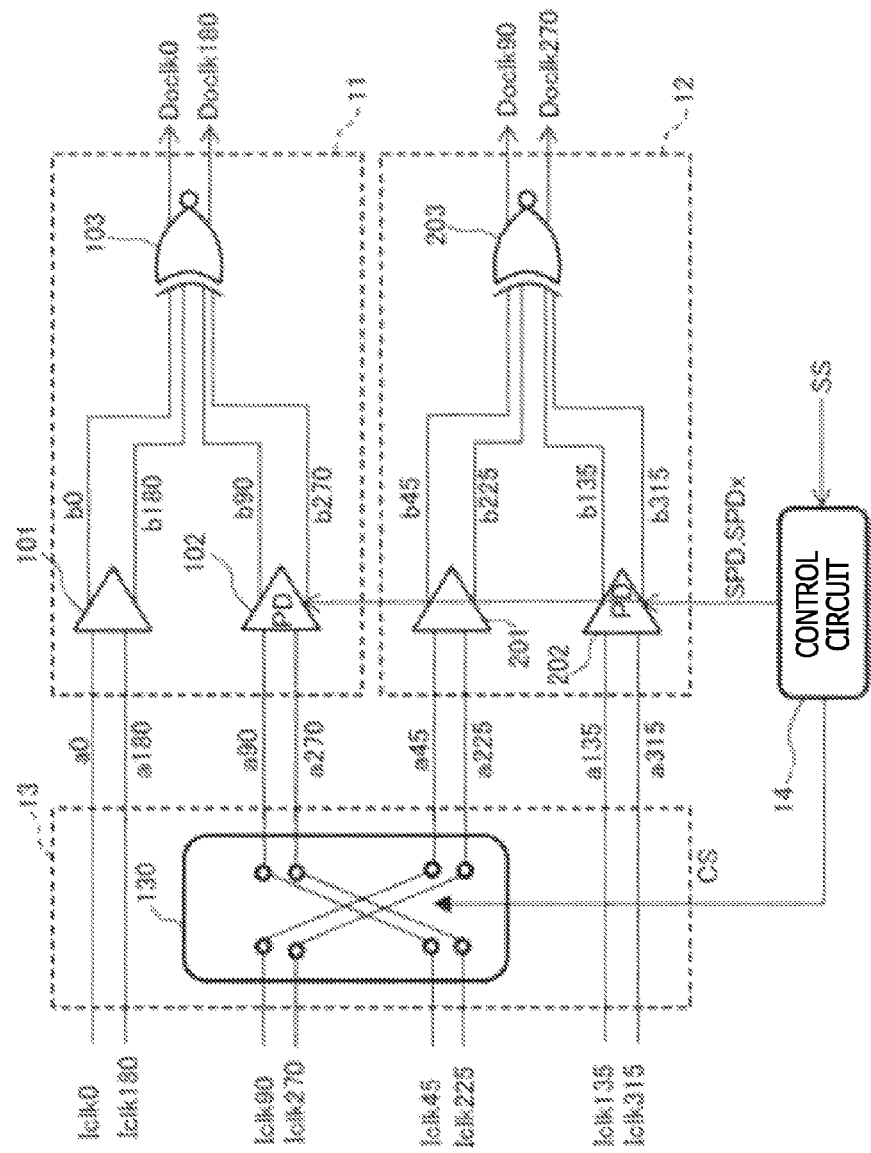
FIG. 7 is a diagram illustrating an example of the clock control circuit illustrated in FIG. 6.

FIG. 7 is a diagram illustrating an example of the clock control circuit illustrated in FIG. 6, and illustrates an example in which the phase shift circuit 13 is configured as a switch 130. In addition, a connection state of the switch 130 illustrated in FIG. 7 is a state at the time of power-down, and a connection state in the normal operation represents a state where the input clock passes through from the left hand side to the right hand side, just as it is.

That is, at the time of normal operation, the switch 130 is in a state of connection of passing through, and the input clocks Iclk90 and Iclk270 become output clocks a90 and a270, just as they are, and the input clocks Iclk45 and Iclk225 become the output clocks a45 and a225, just as they are.

In addition, at both the time of normal operation and the time of power-down, the input clocks Iclk0 and Iclk180 become the output clocks a0 and a180, just as they are, and the input clocks Iclk135 and Iclk315 become the output clocks a135 and a315, just as they are.

Accordingly, the clocks a0 and a180 from the phase shift circuit 13 are input to the first buffer 101 of the frequency multiplication circuit 11, and the clocks a90 and a270 are input to the second buffer 102 of the frequency multiplication circuit 11.

In addition, the clocks a45 and a225 from the phase shift circuit 13 are input to the first buffer (third buffer) 201 of the frequency multiplication circuit 12, and the clocks a135 and a315 are input to the second buffer (fourth buffer: power-down-equipped buffer) 202 of the frequency multiplication circuit 12.

As a result, in the normal operation, the clock control circuit 1 outputs a clock with f/2 frequency that is obtained by multiplying the f/4 frequency of the eight-phase clocks Iclk0 to Iclk315 which is input, in the same manner as the clock control circuit 10 (frequency multiplication circuits 11 and 12) described with reference to FIG. 1 and FIG. 2.

That is, the frequency multiplication circuit 11 receives the four-phase clocks Iclk0, Iclk90, Iclk180, and Iclk270 with f/4 frequency, and generates the complementary clocks Doclk0 (X2clk0) and Doclk180 (X2clk180), phases of which are different from each other by 180° with f/2 frequency that is obtained by being multiplied (multiplied by 2) to be output.

In addition, the frequency multiplication circuit 12 receives the four-phase clocks Iclk45, Iclk135, Iclk225, and Iclk315 with f/4 frequency, and generates the complementary clocks Doclk90 (X2clk90) and Doclk270 (X2clk270), phases of which are different from each other by 180° with f/2 frequency that is obtained by being multiplied to be output. In addition, the output clocks Doclk0 and Doclk180 of the frequency multiplication circuit 11 and the output clocks Doclk90 and Doclk270 of the frequency multiplication circuit 12 have a phase difference of 90° between each other.

In contrast to this, at the time of power-down, the switch 130 is in a connection state such as that of FIG. 7. That is, at the time of power-down, by the phase shift circuit 13 (switch 130), the input clocks Iclk90 and Iclk270 are output as the output clocks a45 and a225 and the input clocks Iclk45 and Iclk225 are output as the output clocks a90 and a270.

In addition, as previously described, even at the time of power-down, the input clocks Iclk0 and Iclk180 become the output clocks a0 and a180, just as they are, and the input clocks Iclk135 and Iclk315 become the output clocks a135 and a315, just as they are.

Here, the frequency multiplication circuits 11 and 12 of the clock control circuit 1 according to the present embodiment are the same as those of the clock control circuit 90 described with reference to FIGS. 3 to 5, and at the time of power-down, the outputs OUT1 and OUT2 of the second buffer (102) of the frequency multiplication circuits 11 and 12 are set to fixed levels.

However, since the input and output logics of each of the buffers 101, 102, 201, and 202 have to be consistent with each other, the output OUT1 is fixed to a high level "H", and the output OUT2 is fixed to a low level "L".

That is, the second buffer 102 of the frequency multiplication circuit 11 outputs a signal b90 that is fixed to a high level "H", and a signal b270 that is fixed to a low level "L", regardless of the levels of the input clocks a90 and a270.

In the same manner, the second buffer 202 of the frequency multiplication circuit 12 outputs a signal b135 that is fixed to a high level "H", and a signal b315 that is fixed to a low level "L", regardless of the levels of the input clocks a135 and a315.

Figure 8:
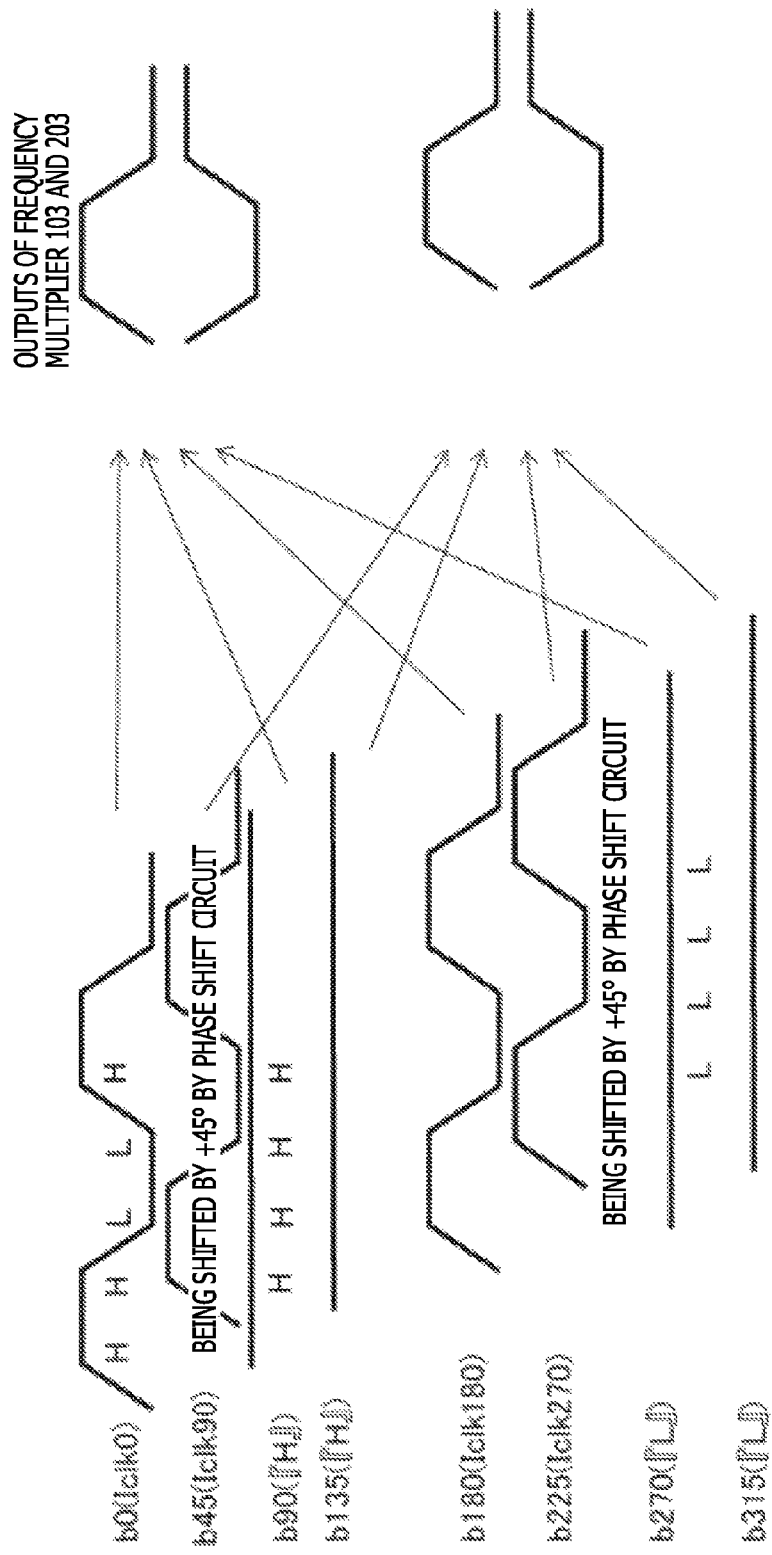
FIG. 8 is a diagram for explaining an operation of the clock control circuit illustrated in FIG. 7.

FIG. 8 is a diagram for explaining an operation of the clock control circuit illustrated in FIG. 7, and illustrates the input signals (clocks b0 to b315) and the output signals (clocks Doclk0, Doclk90, Doclk180, Doclk270) of frequency multipliers 103 and 203 at the time of power-down.

In addition, the frequency multipliers 103 and 203 are configured with EXORs or EXNORs. That is, the frequency multipliers 103 and 203 perform an exclusive NOR (EX-NOR) operation or an exclusive OR (EXOR) operation on the fixed level ("H": b90 and b135, "L": b270 and b315) and the clocks (b0, b270, b180, and b225), and generate the clocks Doclk0, Doclk90, Doclk180, and Doclk270.

In this way, according to the clock control circuit of the second embodiment, it is possible to output by generating the four-phase clocks Doclk0, Doclk90, Doclk180, and Doclk270 with the same f/4 frequency, from the eight-phase clocks Iclk0 to Iclk315 with the f/4 frequency, at the time of power-down. In addition, it is possible to generate the four-phase clocks Doclk0, Doclk90, Doclk180, and Doclk270 with the f/2 frequency that is obtained by being multiplied, from the eight-phase clocks Iclk0 to Iclk315 with the f/4 frequency, and output the clocks, at the time of normal operation.

Figure 9:
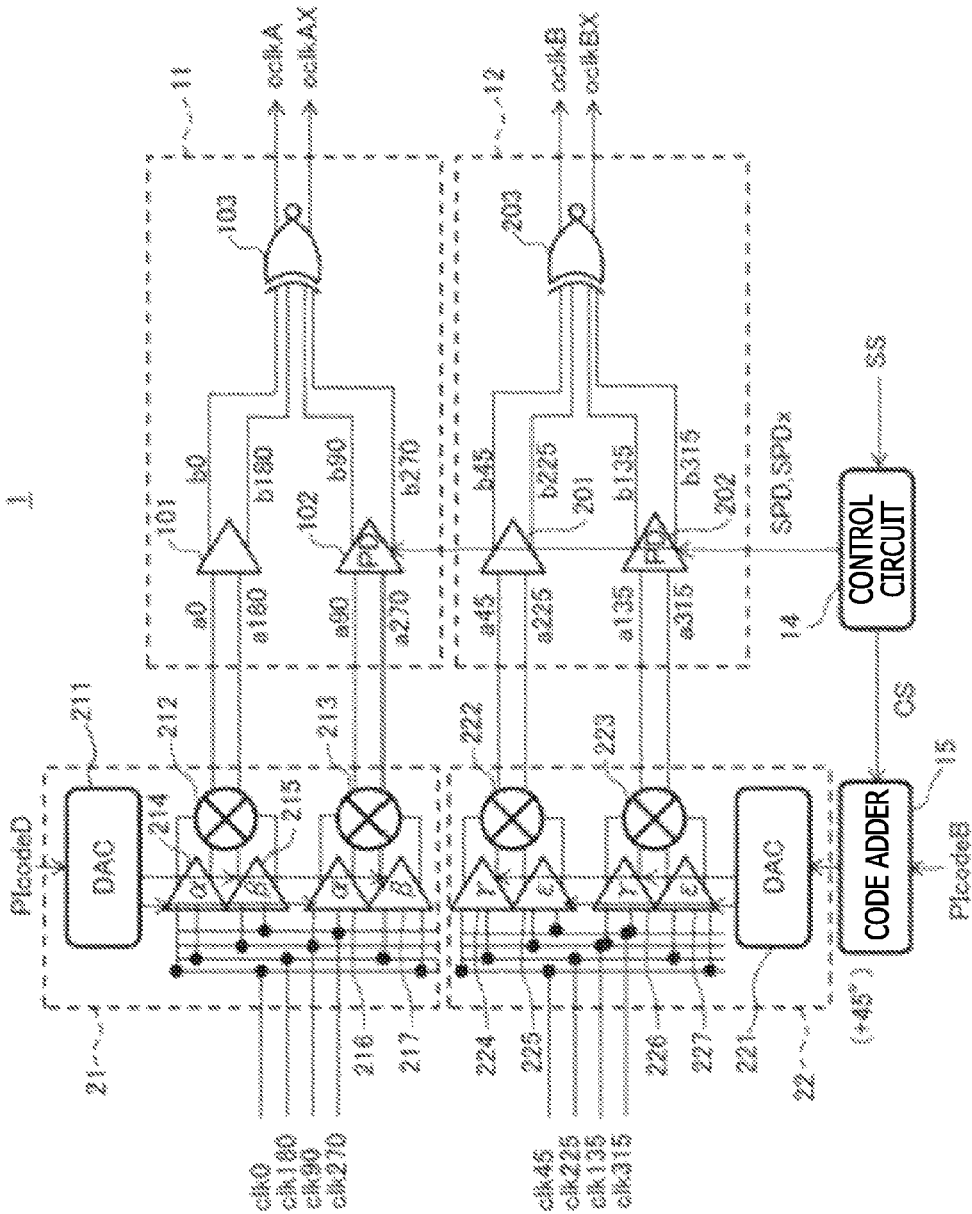
FIG. 9 is a diagram illustrating a third embodiment of the clock control circuit.

FIG. 9 is a diagram illustrating a third embodiment of the clock control circuit. As illustrated in FIG. 9, the clock control circuit according to the third embodiment includes the frequency multiplication circuits 11 and 12, phase interpolators (PIs) 21 and 22, a control circuit 14, and a code adder 15.

The code adder 15 performs a code addition with respect to the phase code PIcodeB from the code generator (73), based on an output signal CS of the control circuit 14, and for example, shifts the clocks clk45, clk135, clk225, and clk315 by +45°. Here, for example, the code adder 15 corresponds to the phase shift circuit 13 of the clock control circuit illustrated in FIG. 6, but performs the phase shift of the clock via the PI 22.

In addition, for example, the code adder 15 stores in advance a phase code corresponding to +45°, and adds the stored phase code to the phase code PIcodeB based on the output signal CS of the control circuit 14, but may output directly the phase code corresponding to +45° from the control circuit 14 to the code adder 15.

As illustrated in FIG. 9, the PI 21 receives the four-phase clocks clk0, clk90, clk180, and clk270, and includes buffers 214 and 216 that provides weight α, and buffers 215 and 217 that provides weight β, with respect to two clocks, respectively. The buffers 214 to 217 are controlled by a D/A converter (DAC) 211 that receives the phase code PIcodeD from the code generator and performs a digital/analog conversion.

The outputs of the buffers 214 and 215 are input to a mixer 212, and clocks a0 and a180 that are obtained by performing phase interpolation based on a phase code PIcodeD are output from the mixer 212. In addition, the outputs of the buffers 216 and 217 are input to a mixer 213, and clocks a90 and a270 that are obtained by performing phase interpolation based on the phase code PIcodeD are output from the mixer 213.

The PI 22 receives the four-phase clocks clk45, clk135, clk225, and clk315, and includes buffers 224 and 226 that provides weight γ, and buffers 225 and 227 that provides weight ε, with respect to two clocks, respectively. The buffers 224 to 227 are controlled by a D/A converter (DAC) 221 that receives the output code from the code adder 15 and performs a digital/analog conversion.

Here, at the time of normal operation, the code adder 15 outputs the phase code PIcodeB from the code generator, just as the phase code is, and meanwhile, at the time of power-down, the code adder 15 outputs a code that is obtained by adding a code of 45° to the phase code PIcodeB.

The outputs of the buffers 224 and 225 are input to a mixer 222, and clocks a45 and a225 that are obtained by performing phase interpolation, based on the phase code PIcodeB, or a phase code which is obtained by adding a code of +45° to the phase code PIcodeB, are output from the mixer 222.

In addition, the outputs of the buffers 226 and 227 are input to a mixer 223, and clocks a135 and a315 that are obtained by performing phase interpolation, based on the phase code PIcodeB, or a phase code which is obtained by adding a code of +45° to the phase code PIcodeB, are output from the mixer 223.

Figure 10:
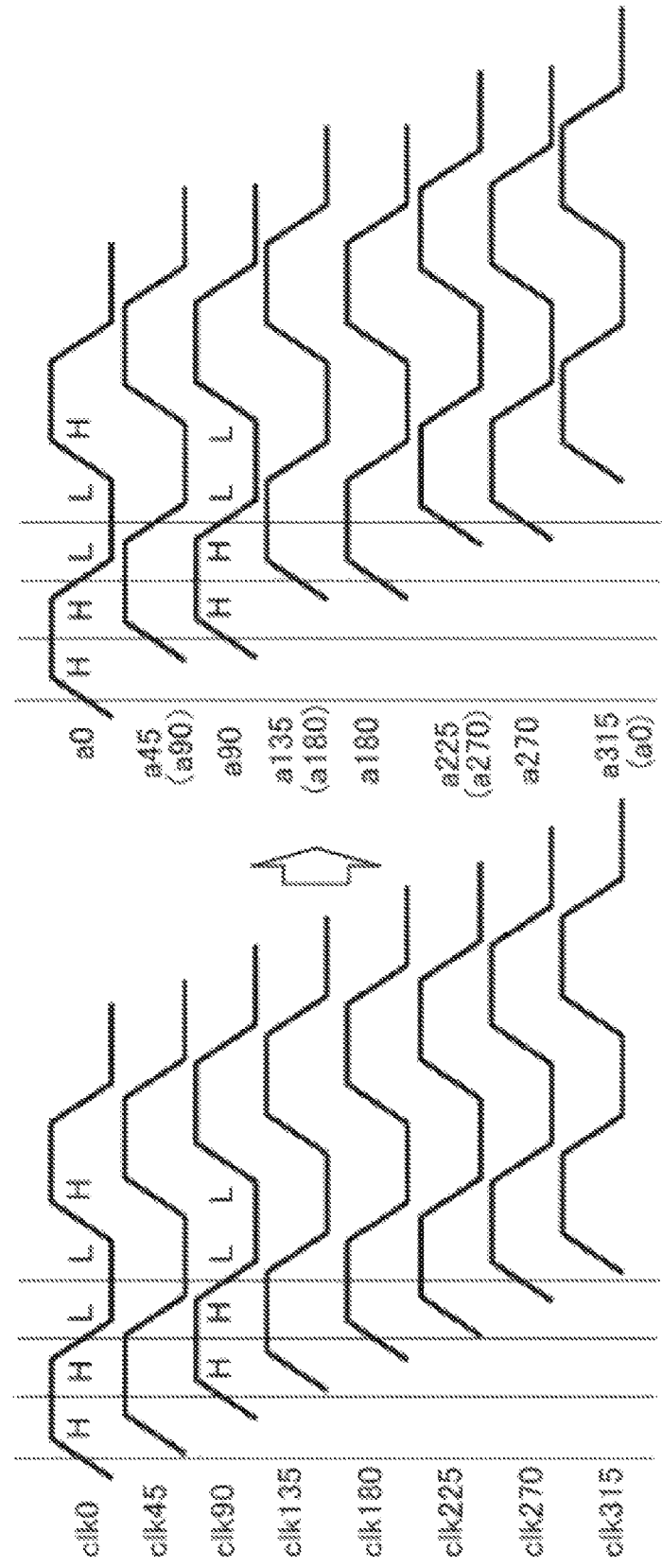
FIG. 10 is a diagram (1) for explaining an operation of the clock control circuit illustrated in FIG. 9.
Figure 11:
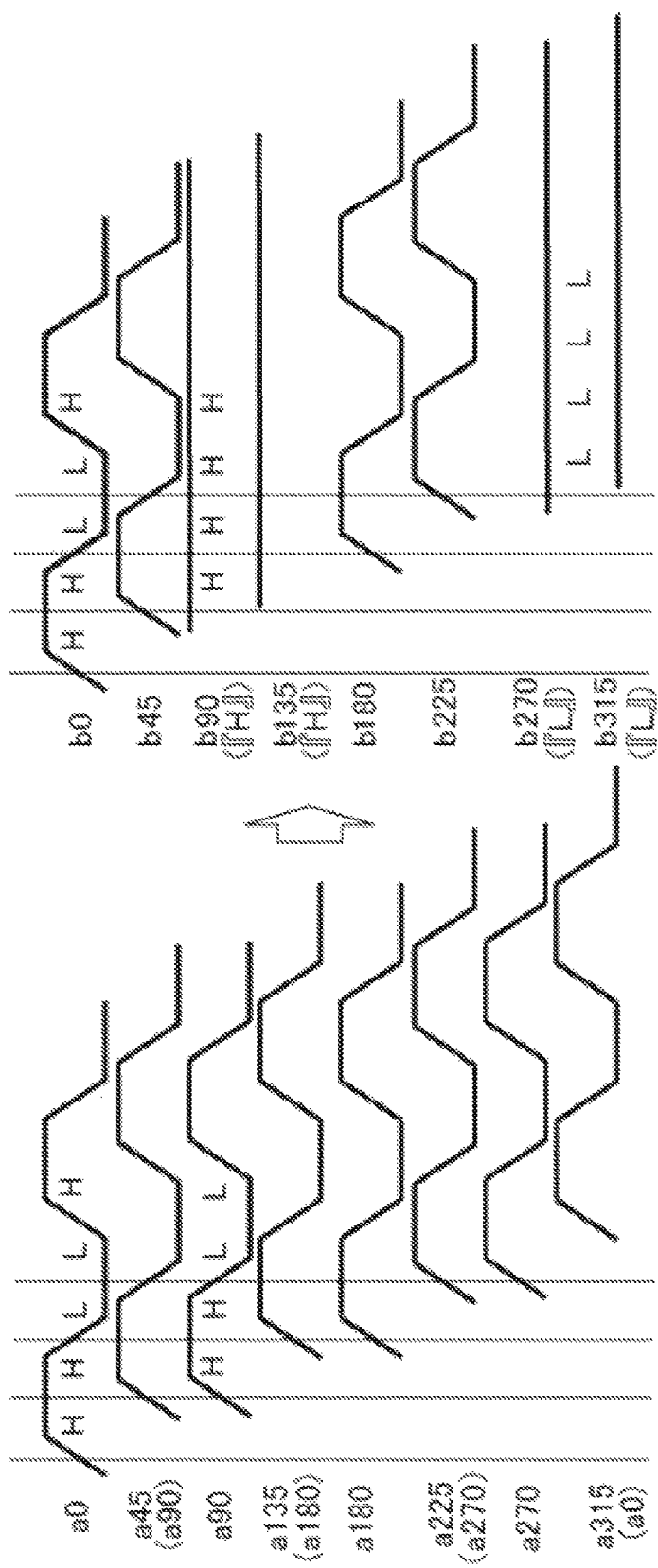
FIG. 11 is a diagram (2) for explaining an operation of the clock control circuit illustrated in FIG. 9.
Figure 12:
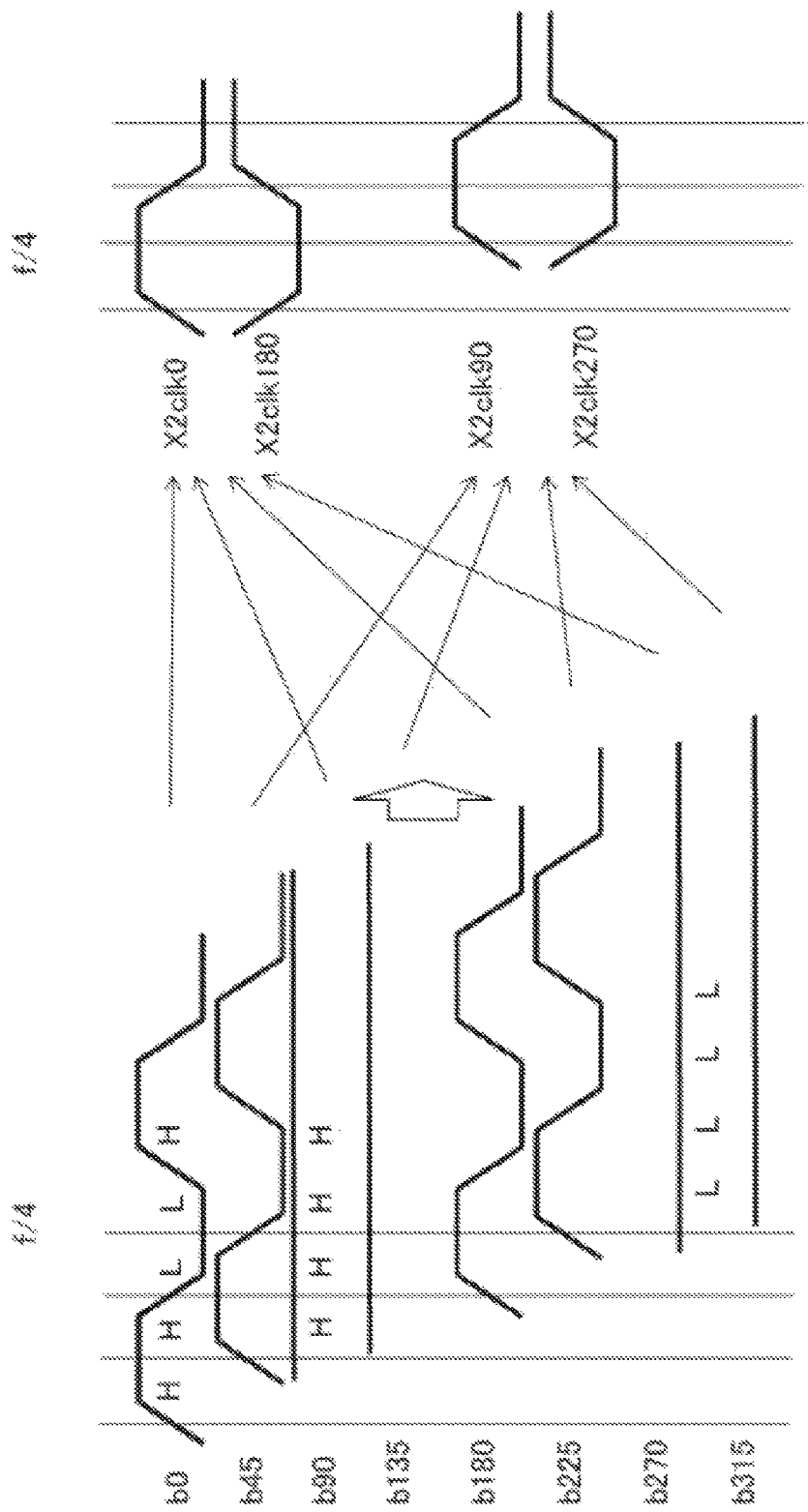
FIG. 12 is a diagram (3) for explaining an operation of the clock control circuit illustrated in FIG. 9.

FIGS. 10 to 12 are diagrams for explaining an operation (operation at the time of power-down) of the clock control circuit illustrated in FIG. 9. In addition, for example, the operation of the clock control circuit at the time of normal operation is the same as that described with reference to FIGS. 1 and 2.

That is, at the time of normal operation, the clock control circuit 1 outputs four-phase clocks OclkA, OclkB, OclkAX, and OclkBX with f/2 frequency that is obtained by multiplying the f/4 frequency of the eight-phase clocks clk0 to clk315 which are input.

As previously described, at the time of power-down, the PI 22 outputs clocks that are phase-shifted by +45° according to the output code of the code adder 15, with respect to the four-phase clocks clk45, clk135, clk225, and clk315.

That is, as illustrated in FIG. 10, the clocks a45, a135, a225, and a315 that are output from the PI 22 become clocks corresponding to a90, a180, a270, and a360 (a0), respectively.

Here, as illustrated in FIG. 11, at the time of power-down, the outputs of the second buffers 102 and 202 of the frequency multiplication circuits 11 and 12 are in the fixed levels. That is, the clocks b90 and b135 are fixed to a high level "H", and the clocks b270 and b315 are fixed to a low level "L".

Accordingly, as may be seen from the comparison of FIG. 12 and the FIG. 8 previously described, the input signals (clocks b0 to b315) and output signals (clocks Doclk0, Doclk90, Doclk180, Doclk270) of the frequency multipliers 103 and 203 at the time of power-down are illustrated. In addition, the frequency multipliers 103 and 203 are configured with EXORs or EXNORs.

In this way, according to the clock control circuit of the third embodiment, it is possible to generate the four-phase clocks OclkA, OclkB, OclkAX, and OclkBX with the same f/4 frequency, from the eight-phase clocks clk0 to clk315 with f/4 frequency, and to output the clocks, at the time of power-down. In addition, it is possible to generate the four-phase clocks OclkA, OclkB, OclkAX, and OclkBX with the f/2 frequency that is obtained by being multiplied, from the eight-phase clocks Iclk0 to Iclk315 with f/4 frequency, and to output the clocks, at the time of normal operation.

In this way, since the clock control circuit according to the third embodiment uses the phase shift circuit as the code adder 15, a phase code for shifting by, for example, +45° is added to the phase code PIcodeB from the CDR 7.

In the clock control circuit according to the third embodiment, the phase shift may be performed not by a switch, but by calculation at a low frequency such as a phase code of the PI 22, and it is possible to perform a phase shift without a band limit of RC delay caused by a switch, or without characteristic degradation of the clock with a high frequency.

In addition, for example, the clock control circuit according to the third embodiment illustrated in FIG. 9 may also be realized by, for example, the clock control circuit according to the second embodiment illustrated in FIG. 6, that is, phase shift performed by a switch.

That is, the phase shift circuit 13 may be used as a switch, and at the time of normal operation, the clocks a45, a225, a135, and a315 input to the buffers 201 and 202 may be replaced with the clocks Iclk45, Iclk225, Iclk135, and Iclk315, and at the time of power-down, the clocks a45, a225, a135, and a315 input to the buffers 201 and 202 may be replaced with the clocks Iclk90, Iclk270, Iclk180, and Iclk0.

However, for example, there is a possibility that in a case of applying such a switch, an effect contrary to that of the third embodiment described above may appear, and particularly, in a case of using a high speed clock, a band limit of RC delay caused by a switch or characteristic degradation of a clock of a high frequency may occur. Accordingly, for example, in order to process a high speed clock such as several tens of GHz, it is preferable that the phase code PIcodeB of the phase interpolator (PI) 21 be processed by the code adder 15, as described in the third embodiment.

Figure 13:
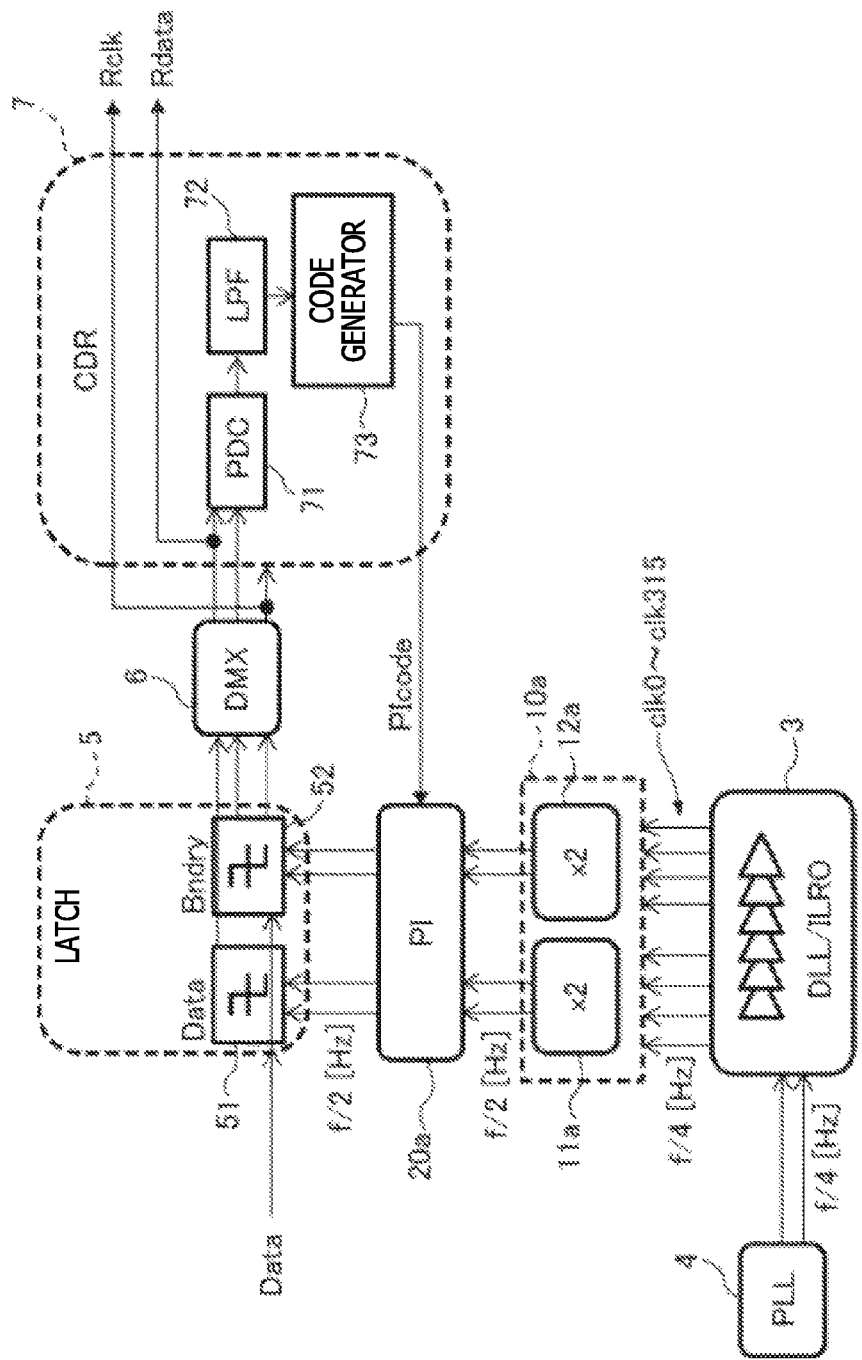
FIG. 13 is a block diagram illustrating another example of a receiver.

FIG. 13 is a block diagram illustrating another example of the receiver. As may be seen from a comparison of FIG. 13 and FIG. 1 previously described, in the receiver 9 illustrated in FIG. 13, the eight-phase clocks clk0 to clk315 from the DLL/ILRO3 are input directly to frequency multiplication circuits 11a and 12a of a clock control circuit 10a.

Outputs of the frequency multiplication circuits 11a and 12a are input to the data determination circuit 51 and the boundary determination circuit 52, via a phase interpolation circuit 20a, and data determination and boundary determination are performed. That is, the receiver 9 illustrated in FIG. 13 corresponds to a configuration in which an order of the clock control circuit 10 and phase interpolation circuit 20 is changed, in the receiver 8 illustrated in FIG. 1.

In addition, the DLL/ILRO 3, the PLL 4, the latch 5 (data determination circuit 51 and boundary determination circuit 52), the DMX 6, and the CDR 7 are the same as those described with reference to FIG. 1.

Figure 14:
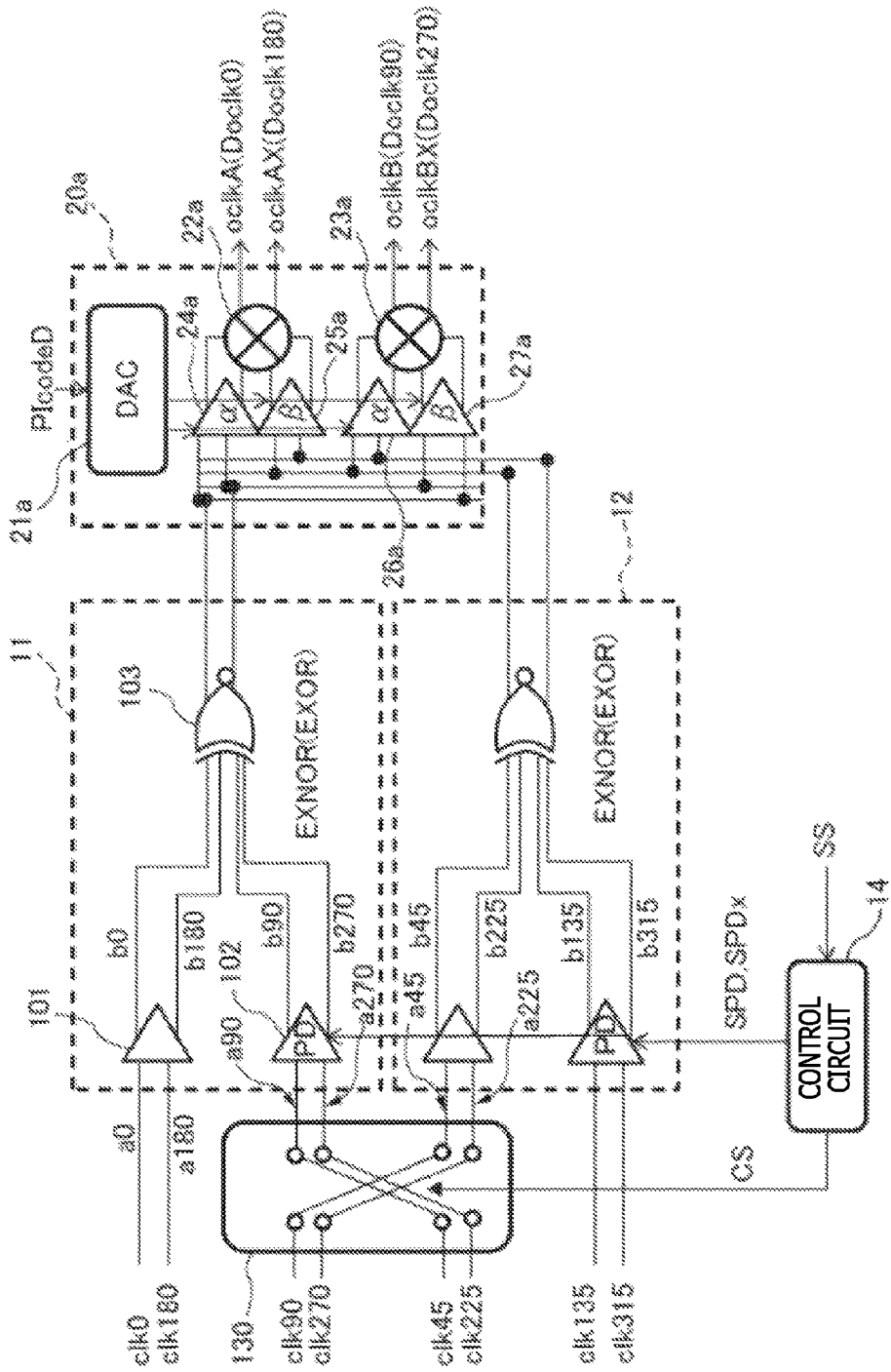
FIG. 14 is a block diagram illustrating a fourth embodiment of the clock control circuit that is applied to the receiver illustrated in FIG. 13.

FIG. 14 is a block diagram illustrating a fourth embodiment of the clock control circuit that is applied to the receiver illustrated in FIG. 13. The configuration of the clock control circuit according to the fourth embodiment illustrated in FIG. 14 corresponds to a configuration in which the clock control circuit according to the second embodiment described with reference to FIG. 7 is applied to the receiver 9 illustrated in FIG. 13.

In addition, in the clock control circuit according to the fourth embodiment, a phase interpolation circuit 20a may be configured by only one phase interpolator (PI) 21a, but for example, an operation frequency of the PI 21a is two times the operation frequency of the PIs 21 and 22 illustrated in FIG. 9. In this way, the clock control circuit and receiver according to the present embodiment may be modified and changed in various forms.

In addition, in the above description, four-phase clocks, phases of which are different from each other by 90°, and eight-phase clocks, phases of which are different from each other by 45° are exemplified as multi-phase clocks that are input, which are not limited to this.

In addition, by configuring the clock control circuit of each embodiment to have multi-stages, it is also possible to set the output clock frequency of the clock control circuit to not only f/2 and f/4, but also, for example, f/8 or f/16, with respect to, for example, f/4 frequency of the input clock.

Figure 15:
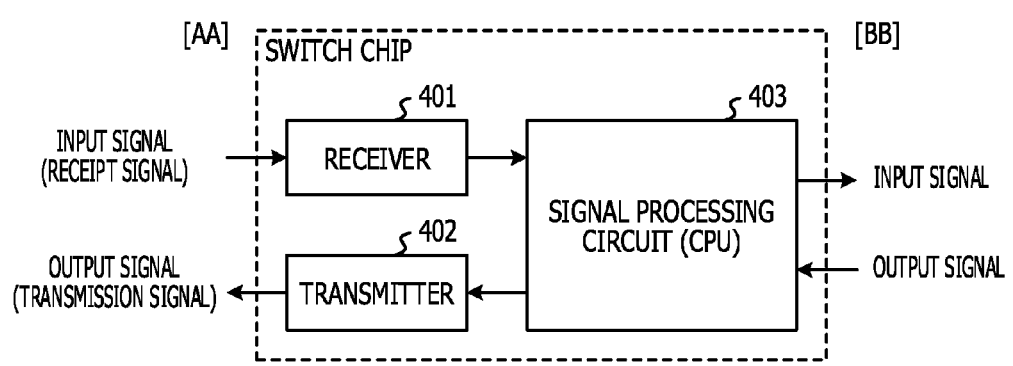
FIG. 15 is a block diagram illustrating an example of a communication device (semiconductor integrated circuit: switch chip) to which the receiver according to the present embodiment is applied.

FIG. 15 is a block diagram illustrating an example of a communication device (semiconductor integrated circuit: switch chip) to which the receiver according to the present embodiment is applied. As illustrated in FIG. 15, the receiver 401 according to the first to fourth embodiments described above may be applied to a switch chip 400. That is, for example, the switch chip 400 includes the receiver 401, a transmitter 402, and a signal processing circuit (CPU) 403 that are provided on one semiconductor chip.

The receiver 401 receives an input signal (received signal) from an external device AA of the switch chip 400, and the signal processing circuit 403 processes the input signal that is input via the receiver 401. A signal (output signal) that is processed by the signal processing circuit 403 is output to the external device AA of the switch chip 400 via the transmitter 402.

Here, the external device AA of the switch chip 400 is, for example, a semiconductor chip (semiconductor integrated circuit), a server or board (printed wiring board) connected via a network, or the like. In addition, in FIG. 15, in a case where a reference numeral BB denotes, for example, a semiconductor integrated circuit or a printed wiring board other than the semiconductor integrated circuit or the printed wiring board AA, a receiver and a transmitter may be further provided between the signal processing circuit 403 and BB.

In addition, application of the receiver according to the present embodiment is not limited to the switch chip 400 illustrated in FIG. 15, and may be widely applied, with respect to various receivers of a semiconductor integrated circuit, an I/O circuit (input and output circuit), or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A clock control circuit comprising:
a first buffer that receives a first pair of input clocks of multi-phase clocks, buffers and outputs the first pair of input clocks;
a second buffer that receives a second pair of input clocks of the multi-phase clocks, and is controllable to buffer and output the second pair of input clocks or to output a fixed level; and
a frequency multiplier that performs a logical operation on an output of the first buffer and an output of the second buffer, and outputs a first pair of output clocks or a second pair of output clocks as an output clocks, the first pair of output clocks is based on a frequency which is obtained by multiplying frequencies of the multi-phase clocks, and the second pair of output clocks is based on the same frequencies as the multi-phase clocks;
wherein the second buffer includes a first operation mode that buffers and outputs the second pair of input clocks, and a second operation mode that outputs a high level and a low level of the fixed level.

2. The clock control circuit according to claim 1,
wherein the multi-phase clocks are four-phase clocks, phases of which are different from each other by 90°, and
wherein the first pair of input clocks and the second pair of input clocks are respective complementary clocks, phases of which are different from each other by 180°.

3. The clock control circuit according to claim 1,
wherein the frequency multiplier includes a logic circuit that performs an exclusive OR operation on the output of the first buffer and the output of the second buffer.

4. The clock control circuit according to claim 1,
wherein the first operation mode is an operation mode at the time of normal operation in which the first and second buffers buffer and output the first pair of input clocks and second pair of input clocks, and
wherein the second operation mode is an operation mode at the time of power-down in which the second buffer outputs the fixed level regardless of a level of the second pair of input clocks.

5. A clock control circuit comprising:
a phase shift circuit that receives first multi-phase clocks and outputs second multi-phase clocks which are obtained by phase-shifting a predetermined clock;
a first buffer that receives a first pair of input clocks of the second multi-phase clocks, and buffers and outputs the first pair of input clocks;
a second buffer that receives a second pair of input clocks of the second multi-phase clocks, and is controllable to buffer and output the second pair of input clocks or to output a fixed level;
a first frequency multiplier that performs a logical operation on an output of the first buffer and an output of the second buffer, and outputs a first pair of output clocks or a second pair of output clocks as an output clock, the first pair of output clocks is based on a frequency which is obtained by multiplying frequencies of the first multi-phase clocks, and the second pair of output clocks is based on the same frequencies as the first multi-phase clocks;
a third buffer that receives a third pair of input clocks of the second multi-phase clocks, and buffers and outputs the third pair of input clocks;
a fourth buffer that receives a fourth pair of input clocks of the second multi-phase clocks, and is controllable to buffer and output the fourth pair of input clocks or to output a fixed level; and
a second frequency multiplier that performs a logical operation on an output of the third buffer and an output of the fourth buffer, and outputs a third pair of output clocks or a fourth pair of output clocks as an output clock, the third pair of output clocks is based on a frequency which is obtained by multiplying frequencies of the first multi-phase clocks, and the fourth pair of output clocks is based on the same frequencies as the first multi-phase clocks.

6. The clock control circuit according to claim 5,
wherein the first multi-phase clocks are eight-phase clocks, phases of which are different from each other by 45°, and
wherein the first pair of input clocks, the second pair of input clocks, the third pair of input clocks, and the fourth pair of input clocks are respective complementary clocks, phases of which are different from each other by 180°.

7. The clock control circuit according to claim 5,
wherein the first frequency multiplier includes a circuit that performs an exclusive OR operation on an output of the first buffer and an output of the second buffer, and
wherein the second frequency multiplier includes a circuit that performs an exclusive OR operation on an output of the third buffer and an output of the fourth buffer.

8. The clock control circuit according to claim 5,
wherein the second and fourth buffers include a first operation mode that buffers and outputs the second pair of input clocks and fourth pair of input clocks, and a second operation mode that outputs a high level and a low level of the fixed level.

9. The clock control circuit according to claim 8,
wherein the first operation mode is an operation mode at the time of normal operation in which the first to fourth buffers buffer and output the first to fourth pair of input clocks, and
wherein the second operation mode is an operation mode at the time of power-down in which the second and fourth buffers output the fixed level regardless of levels of the second and fourth clock pairs.

10. The clock control circuit according to claim 8,
wherein the phase shift circuit includes a switch that switches a predetermined clock of the first multi-phase clocks in the second operation mode.

11. The clock control circuit according to claim 8,
wherein in the second operation mode, the phase shift circuit includes a code adder that adds a predetermined code to a phase code with respect to a phase interpolator, and shifts a phase of a predetermined clock of the first multi-phase clocks.

12. A receiver comprising:
a clock control circuit including
a phase shift circuit that receives first multi-phase clocks and outputs second multi-phase clocks which are obtained by phase-shifting a predetermined clock,
a first buffer that receives a first pair of input clocks of the second multi-phase clocks, buffers and outputs the first pair of input clocks,
a second buffer that receives a second pair of input clocks of the second multi-phase clocks, and is controllable to buffer and input the second pair of input clocks or to output a fixed level,
a first frequency multiplier that performs a logical operation on an output of the first buffer and an output of the second buffer, and outputs a first pair of output clocks or a second pair of output clocks as an output clock, first pair of output clocks is based on a frequency which is obtained by multiplying frequencies of the first multi-phase clocks, and the second pair of output clocks is based on the same frequencies as the first multi-phase clocks,
a third buffer that receives a third pair of input clocks of the second multi-phase clocks, buffers and outputs the third pair of input clocks,
a fourth buffer that receives a fourth pair of input clocks of the second multi-phase clocks, and is controllable to buffer and output the fourth pair of input clocks or to output a fixed level, and
a second frequency multiplier that performs a logical operation of an output of the third buffer and an output of the fourth buffer, and outputs a third pair of output clocks or a fourth pair of output clocks as an output clock, the third pair of output clocks is based on a frequency which is obtained by multiplying frequencies of the first multi-phase clocks, and a fourth pair of output clocks is based on the same frequencies as the first multi-phase clocks;
a data determination circuit that determines data based on a first output clock from the clock control circuit;
a boundary determination circuit that determines a boundary based on a second output clock from the clock control circuit; and
a clock data recovery that controls a phase interpolator based on outputs of the data determination circuit and the boundary determination circuit.

13. A communication device comprising:
a receiver receives an input signal from an external device;
a signal processing circuit processes the input signal that is input via the receiver; and
a transmitter output an output signal that is processed by the signal processing circuit to the external device,
wherein the receiver comprising:
a clock control circuit including
a phase shift circuit that receives first multi-phase clocks and outputs second multi-phase clocks which are obtained by phase-shifting a predetermined clock,
a first buffer that receives a first pair of input clocks of the second multi-phase clocks, buffers and outputs the first pair of input clocks,
a second buffer that receives a second pair of input clocks of the second multi-phase clocks, and is controllable to buffer and input the second pair of input clocks or to output a fixed level,
a first frequency multiplier that performs a logical operation on an output of the first buffer and an output of the second buffer, and outputs a first pair of output clocks or a second pair of output clocks as an output clock, first pair of output clocks is based on a frequency which is obtained by multiplying frequencies of the first multi-phase clocks, and the second pair of output clocks is based on the same frequencies as the first multi-phase clocks,
a third buffer that receives a third pair of input clocks of the second multi-phase clocks, buffers and outputs the third pair of input clocks,
a fourth buffer that receives a fourth pair of input clocks of the second multi-phase clocks, and is controllable to buffer and output the fourth pair of input clocks or to output a fixed level, and
a second frequency multiplier that performs a logical operation of an output of the third buffer and an output of the fourth buffer, and outputs a third pair of output clocks or a fourth pair of output clocks as an output clock, the third pair of output clocks is based on a frequency which is obtained by multiplying frequencies of the first multi-phase clocks, and a fourth pair of output clocks is based on the same frequencies as the first multi-phase clocks;
a data determination circuit that determines data based on a first output clock from the clock control circuit;
a boundary determination circuit that determines a boundary based on a second output clock from the clock control circuit; and
a clock data recovery that controls a phase interpolator based on outputs of the data determination circuit and the boundary determination circuit.

* * * * *